United States Patent [19]

West et al.

[11] Patent Number: 4,569,953

[45] Date of Patent: Feb. 11, 1986

[54] PHOTOACTIVATED POLYMERIZATION OF VINYL MONOMERS BY POLYSILANES

[75] Inventors: Robert C. West; Andrew R. Wolff, both of Madison, Wis.

[73] Assignee: Minnesota Mining and Manufacturing Company, St. Paul, Minn.

[21] Appl. No.: 584,503

[22] Filed: Feb. 28, 1984

[51] Int. Cl.$^4$ ............................. C08F 2/50; C08F 4/16
[52] U.S. Cl. ........................................ 522/6; 522/182; 522/188; 522/904; 526/194; 525/479
[58] Field of Search ....................... 204/159.13, 159.23

[56] References Cited

PUBLICATIONS

Allen "Kinetics & Mechanisms of Polymerization Reactions" Wiley & Sons 1974, pp. 110–111.

*Primary Examiner*—John C. Bleutge
*Assistant Examiner*—A. H. Koeckert
*Attorney, Agent, or Firm*—Donald M. Sell; James A. Smith; David L. Weinstein

[57] ABSTRACT

Exposure to light or an energetic source of radiation of a mixture of a vinyl monomer or prepolymer with a photo-activatable polysilane results in the polymerization of the vinyl monomer or prepolymer.

14 Claims, No Drawings

PHOTOACTIVATED POLYMERIZATION OF VINYL MONOMERS BY POLYSILANES

BACKGROUND OF THE INVENTION

Silicon is capable of extensive catenation. Thus, linear dimethyl polysilanes containing chains of up to twenty four directly bonded silicon atoms, high molecular weight polymers based on chains of silicon atoms and cyclopolysilanes with as many as thirty five silicon atoms in a single ring have all been prepared. (See R. West in G. Wilkinson, F. G. A. Stone and E. W. Abel Eds., "Comprehensive Organometallic Chemistry," Pergamon Press, New York, N.Y., 1982, vol. 2, chapter 9.4.). Such materials can be degraded by application of heat (pyrolyzed) to give SiC ceramic materials, including in some cases strong SiC fibers (U.S. Pat. Nos. 4,260,780, 4,276,424 and 4,276,424). Furthermore, some of the polysilanes can themselves be formed into films of fibers or molded, cast or spun from hot melt or from solution (U.S. Pat. No. 4,324,901).

SUMMARY OF THE INVENTION

It has been found in connection with the present invention that certain catenated polysilanes are photoactivatable and that they possess the ability to photochemically initiate the polymerization of vinyl(ethylenically unsaturated) monomers and prepolymers. Thus, this invention relates, in one of its aspects, to the use of polysilanes as initiators for the photopolymerization of unsaturated compounds (including both linear polymerization and crosslinking).

More specifically, this comprises subjecting a mixture of
  (1) a vinyl monomer or prepolymer, and
  (2) a polysilane having a chain of catenated silicon atoms (which may appear in an open chain or in a ring configuration) and a molecular weight of from about $5 \times 10^2$ to $5 \times 10^6$ to electromagnetic energy having wavelengths in the absorption range of from about 250 to 400 nanometers (nm) until the degree of polymerization of the monomer or prepolymer has increased.

Preferably the mixture contains from about 0.01%–10% by weight of (2), based on the total weight of (1) and (2). The polysilane is preferably (but not necessarily) soluble in the monomer or the prepolymer. For convenience herein, reference is often made only to monomers. However, it will be understood that prepolymers are also contemplated and included.

In a preferred subclass of the processes according to the invention the polysilane has the formula

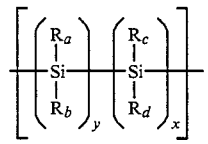

I wherein $R_a$, $R_b$, $R_c$ and $R_d$ are individually selected from aliphatic, aromatic, substituted aromatic, araliphatic and cycloaliphatic groups containing not more than about 18 carbon atoms each (especially phenyl, methyl, cyclohexyl, phenethyl and p-methylphenyl), y and x are numbers from about 1 to 19,000, provided that the sum of y and x is from about 2 to 20,000.

It is understood that in an individual polysilane of formula I, all of the $R_a$ moieties are the same, as are all of the $R_b$ moieties, the $R_c$ moieties and the $R_d$ moieties (although $R_a$ may be the same as or different from $R_b$, and so on). Also, formula I does not indicate any particular degree of order relative to the occurrences of the

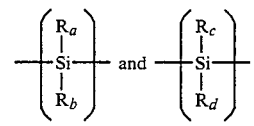

groupings. The end groups in these and the other polysilanes herein are normally not of any substantial significance and include such groups as OH, H and groups conforming to the definition of $R_a$.

More preferred for use in the process are aryl or aralkyl polysilanes in which either $R_a$ is aromatic or aralkyl and $R_b$, $R_c$ and $R_d$ are aliphatic or $R_a$ and $R_c$ are aromatic or aralkyl and $R_b$ and $R_d$ are aliphatic.

Particularly preferred due to the combination of their activity as photoinitiators and their solubility or miscibility with monomers and prepolymers are polysilanes of formula I in which $R_a$ is phenyl, or phenethyl and $R_b$, $R_c$ and $R_d$ are aliphatic and the ratio of x to y varies from about 3:1 to 1:20. Depending upon the ratio and values of x and y, the polysilanes falling within this definition have a wide range of boiling points or melting points.

Also particularly preferred for use in the process of the invention are the polysilanes of formula I wherein $R_a$ and $R_c$ are the same and are phenyl or phenethyl and $R_b$ and $R_d$ are the same and are selected from aliphatic, aromatic, substituted aromatic, araliphatic and cycloaliphatic groups, as broadly defined above. These polysilanes are particularly valuable due to the combination of their high activity as photoinitiator and their solubility in monomers, especially acrylic and methacrylic monomers.

The invention also relates to compositions comprising the mixtures of components (1) and (2) utilized in the process and to the solid reaction products resulting from subjecting the compositions to activating radiation.

The process of the invention is particularly useful where it is desired to provide protective films or coatings on substrates since it has a number of advantages (such as speed, economy, efficiency and the like) over conventional polymerization techniques. The compositions of the invention can thus be conveniently applied as liquids to substrates then polymerized by means of electromagnetic energy, alone or together with elevated temperature, to form hard coatings.

The photoinitiating activity of the polysilanes involves their molecular degradation, although the exact course thereof is unclear. It does appear, however, to involve a free radical mechanism and the degradation has been found to be quite rapid. The photoinitiation of the monomers is particularly efficient in the absence of oxygen.

The polysilane chosen for a particular application will vary depending upon such factors as the nature of the system itself, the polymerization conditions, the desired characteristics of the ultimate product, etc. For example, polysilanes having number average molecular weights (Mn) greater than 2,000 are normally much more effective initiators than are lower molecular weight materials. However, the lower molecular weight polysilanes (oligomers) are sufficiently active for some applications and have improved monomer miscibility. Where the greater activity of the higher molecular weight materials is required, they can often be dispersed in the monomer substrate by suitable mixing, for example ultrasonic mixing (sonication). Irradiation then normally results in a clear solution which subsequently becomes more viscous and hardens.

Polysilanes of the type utilized in the present invention are disclosed in U.S. Pat. Nos. 4,260,780, 4,276,424, 4,314,956 and 4,324,901.

Vinyl(ethylenically unsaturated) monomers which are suitable for use in connection with the present invention are free radical polymerizable and compatible with the polysilanes. These include acrylic acid, methacrylic acid, acrylate and methacrylate esters such as ethyl acrylate, t-butyl acrylate, methyl acrylate, butyl acrylate, 2-ethylhexyl acrylate, cyclohexyl acrylate, and methyl methacrylate, styrene and its derivatives such as 2-chlorostyrene, 2,4-dichlorostyrene, acrylamide and acrylonitrile. Most suitable are styrene and the simple acrylate and methacrylate esters such as ethyl acrylate, isooctyl acrylate, methyl methacrylate and vinyl acetate. Other monomers which can also be used are 2-(N-butylcarbamyl)ethyl methacrylate and 2-(N-ethylcarbamyl)ethyl methacrylate, N-vinyl-2-pyrrolidinone, the acrylic acid and methacrylic acid esters of 1,1-dihydroperfluoroalkanols such as 2,2,2-trifluoroethyl acrylate, 1,1-dihydroperfluoropropyl methacrylate, 1,1-dihydroperfluorobutyl acrylate and 1,1-dihydroperfluorooctyl methacrylate. Other monomers that can be incorporated into the compositions of the invention to increase their crosslink density include 1,4-butylene dimethacrylate or acrylate, 1,1,6,6-tetrahydroperfluorohexanediol diacrylate, ethylene dimethacrylate, glyceryl diacrylate or methacrylate, glyceryl triacrylate or trimethacrylate, pentaerythritol triacrylate or trimethylacrylate, diallyl phthalate, dipentaerythritol pentaacrylate, neopentylglycol triacrylate, 1,3,5-tri(2-methacryloxyethyl)-s-triazine, divinylbenzene, multiacrylates and methacrylates such as ethyleneglycol diacrylate, trimethylolpropane triacrylate, pentaerythritol tri- and tetra-acrylate, the Michael reaction product of diethanolamine and trimethylolpropane triacrylate, and the like.

Mixtures of monomers can also be utilized in order to vary solubility, viscosity, volatility and crosslinking properties of the compositions. Examples of useful comonomers are vinyl aromatics such as vinyl toluene, and vinyl esters such as vinyl acetate, etc.

Energy sources suitable for use in the process of the invention include sunlight, mercury arcs, low-, medium-, and high-pressure mercury lamps, plasma arcs, ultraviolet light emitting diodes, and ultraviolet emitting lasers. Ultraviolet light activation of the polysilanes used in this invention can be brought about with the use of such commercially available ultraviolet light sources as the model LCU 750 medium pressure mercury lamp (UVEXS, Sunnyvale, CA), the model QC 1202 ultraviolet lamp (RPC Equipment, Plainfield, IL) and the Rayonet Model RPR 100 (the Southern New England Ultraviolet Company, Hamden, Conn.).

As mentioned previously, polymerization according to the process of the invention is believed to take place primarily by means of the free radical mechanism. The initial mixtures of the vinyl monomers and the polysilanes according to the invention are frequently of low viscosity, too low in fact to be handled conveniently in some applications. In order to increase the viscosities to a more desirable level in such cases, the mixtures can be prepolymerized until a small degree of polymerization (e.g. 5–10%) has taken place, thus forming a syrup. The irradiation during the prepolymerization is preferably of the same nature as that used for the remainder of the polymerization, so that the polymer formed during both steps is the same. Additional constituents can be incorporated into the mixture and/or the mixture can be coated on a surface or otherwise manipulated at the syrup stage. The polymerization can thereafter be continued, by further irradiation or thermally to form the solid polymeric material.

The process of the invention can often be carried out successfully in relatively thick sections (up to 2 centimeters or even greater) where the polymerizable mixture is relatively transparent to the irradiating energy (or at least transmits a major portion thereof). However, additives such as fillers, extenders, pigments and dyes must be taken into consideration.

The invention is further illustrated by the following nonlimiting examples, in which all parts are given by weight unless otherwise stated. Examples A-S describe the preparation of a number of polysilane photoinitiators and Examples 1–29 illustrate the practice of the present invention, utilizing the polysilanes to polymerize various vinyl monomers. The polysilanes are referred to in Examples 1–29 by the letters of the Examples of their preparation.

EXAMPLE A

Isomeric-PhC$_2$H$_4$SiMe

The intermediate isomeric phenethylmethyldichlorosilane was prepared from methyldichlorosilane and styrene using the methods described by J. L. Speier at pages 435ff of ADVANCES IN ORGANOMETALLIC CHEMISTRY, Academic Press, Edited by F. G. A. Stone and R. West, 17 (1979). It contained approximately 65% of the 2-phenethyl isomer and 35% of the 1-phenethyl isomer.

The polysilane was prepared as follows: To a 3 necked flask fitted with a reflux condenser, a high speed mechanical stirrer, a thermometer and an addition funnel was added under nitrogen 15.9 g of sodium and about 500 ml of toluene (freshly distilled). The addition funnel was charged with 73.81 g of the dichlorosilane intermediate. The solution was heated to toluene reflux and stirred rapidly to produce very finely divided sodium. The heat source (mantle) was removed and the dichlorosilane was added quickly (over 15 minutes), the temperature in the pot remaining at 87°–98° C. The mixture was carefully brought to reflux still stirring and the heating mantle was again removed. A very gentle exothermic reaction ensued and the viscosity of the flask contents increased, making it necessary to cool the solution to approximately 100° C. in order to keep it from foaming. The stirring speed was also decreased.

The reaction was allowed to continue overnight with stirring and the resulting viscous purple solution was poured into 4.5 liters of isopropyl alcohol with rapid, vigorous stirring to shred the polymer. The solid was removed by filtration, dried, redissolved in toluene by stirring for 36 hours, and then precipitated by pouring into 3 liters of methyl alcohol. The mixture was stirred for 12 hours and the (white) precipitate, isomeric (65/35 2-phenethyl/1-phenethyl)poly phenethylmethylsilane, was isolated by filtration and drying. The yield was 8.21 g. The mother liquor from the first filtration was roto evaporated to give 30.8 g of viscous liquid oligomers. GPC analysis of the polymer showed a major peak at $\overline{M}_n$ $8.5 \times 10^5$, a minor peak at $\overline{M}_n$ $1.2 \times 10^4$.

Table I describes polysilanes B-S, which were prepared using the process of Example A. The dichlorosilane intermediates were obtained from Petrarch Systems, Inc., Bristol, PA. Example A is included in the table for convenience of reference. In the second column (which gives the molecular makeup of the polysilanes), a single parenthetical species indicates a homopolymer ($R_aSiR_b$ is the same as $R_cSiR_d$) while two parenthetical species indicate a copolymer. The number following the parentheticals in the copolymers indicates the mole ratio of the first to the second parenthetical species. In all, the side groups present in Polymers A-S include phenyl, methyl, n-hexyl, cyclohexyl, phenethyl, p-methylphenyl (i.e. p-tolyl) and the residue of isooctylacrylate. The phenethyl groups in the polysilanes (i.e. in Polymers A, B, C, E, L and M) are a mixture of the 2- and 1-isomers in the ratio of approximately 65:35. All temperatures are given in °C.

Alternatively, a Rayonet Model RPR 100 Reactor (the Southern New England Ultraviolet Company) fitted with bulbs radiating at 254, 300 or 350 nm was used as the source of radiation. Unless otherwise specified, the 350 nm source was used. The source lamps in all cases were positioned 10-15 cm from the tube.

The molecular weights of the polymers referred to in the following examples, as well as in the claims and throughout the specification, are number average molecular weights, $\overline{M}_n$ (polystyrene equivalent) measured by means of gel permeation chromatography (GPC, also sometimes referred to as size exclusion chromatography). The molecular weight determinations were carried out on tetrahydrofuran solutions of the polymer using the procedure described by West et al, Am. Ceram. Soc. Bull., 62 (8) 899 (1983).

Unless otherwise indicated, Inhibitor-free monomers were prepared by slurrying with alumina followed by filtering and adding the polysilane to the filtrate.

A control tube containing the inhibitor-free monomer, but no polysilane was run in all cases and in all cases it failed to polymerize to any noticeable extent.

EXAMPLE 1

Polysilane A (0.015 g) was added to 10 ml of ethyl acrylate and the mixture was degassed by bubbling

TABLE I

| Polymer | Polysilane[a] | (UV λmax, $\epsilon$/Si $\times 10^{-3}$)[b] | Molecular Weight ($M_n$, GPC)[c] | Comments |
|---|---|---|---|---|
| A | (PhC$_2$H$_4$SiMe) | 306 nm, 6.8 | $8.5 \times 10^5$, $1.2 \times 10^4$ | White powder, Bimodal distn |
| B | (PhC$_2$H$_4$SiMe) .79 (Me$_2$Si) | 305 nm, 5.1 | $3.3 \times 10^5$, $1.1 \times 10^4$ | Bimodal MW distribution, waxy solid softens @ 90-120° |
| C | (PhC$_2$H$_4$SiMe) .56 (PhMeSi) | 327 nm, 5.8 | $4 \times 10^5$, $8.4 \times 10^4$ | Bimodal MW distribution resinous solid softens @ 130-170° |
| D | (CyclohexylSiMe) .63 (PhMeSi) | 334 nm, 7.8 | $8 \times 10^4$ | Resinous solid softens @ 125-160° |
| E | (PhC$_2$H$_4$SiMe) .67 (cyclohexylMeSi) | 310 nm, 6.7 | $1.5 \times 10^5$ | Sticky elastomer softens @ 50-120° |
| F | (CyclohexylSiMe) .66 (Me$_2$Si) | 309 nm, 4.3 | $9 \times 10^5$, $7 \times 10^4$, $9 \times 10^3$ | Trimodal MW distribution, waxy solid softens @ 120-150° |
| G | (cyclohexylSiMe) | 326 nm, 7.6 | $1.7 \times 10^5$ | White powder softens >200° |
| H | (p-tolyylSiMe) .91 (Me$_2$Si) | 332 nm, 5.0 | $1.7 \times 10^5$, $8 \times 10^3$ | Bimodal MW distribution, waxy solid softens @ 130-170° |
| I | (PhMeSi) | 341 nm, 7.0 | $1.0 \times 10^4$, $4 \times 10^3$ | Bimodal MW distribution white powdery solid |
| J | (PhMeSi)[d] | 335 nm, 2-3 | $<3.5 \times 10^3$ | Yellow moblie oil |
| K | (Ph$_2$Si) .89 (Me$_2$Si) | 334 nm, 5.2 | $3.5 \times 10^5$ | White powder softens >170° |
| L | (Ph$_2$Si) 1.65 (PhC$_2$H$_4$SiMe) | 352 nm, 2.5 | $3.0 \times 10^5$ | White powder |
| M | (PhC$_2$H$_4$SiMe) .5 (p-tolylSiMe) | 325 nm, 5.3 | $3.9 \times 10^5$ | Resinous solid softens @ 130-170° |
| N | (Ph$_2$Si) (PhMeSi) | 343 nm, 4.5 | $1.05 \times 10^4$ | White powder |
| O | (isooctylacrylate) 19 (PhMeSi) | 330 nm broad | $7.10^5$, $1.6 \times 10^4$ | Sticky white semisolid |
| P | (PhMeSi) (Me$_2$Si) | 333 nm, 4-5 | $1.7 \times 10^5$, $1.8 \times 10^4$, $4.5 \times 10^3$ | Trimodal distribution White waxy solid |
| Q | (PhMeSi) (Me$_2$Si)[d] | 315 nm, 2-3 | $<3.5 \times 10^3$ | Yellowish oil |
| R | (CyclohexylMeSi) (Me$_2$Si)[d] | 285 nm, 0.7 | $<3.5 \times 10^3$ | Colorless oil |
| S | (CyclohexylMeSi) (n-hexylMeSi)[d] | 300 nm, 0.2 | $<3.5 \times 10^3$ | Colorless oil |

[a]Proportions of different silyl groups in copolymers were determined by proton nuclear magnetic resonance spectroscopy.
[b]Extinction coefficients $\epsilon$ are tabulated per silicon atom, $\times 10^{-3}$.
[c]Molecular weights were determined by gel phase chromatography and are reported in polystyrene equivalents.
[d]Oligomers.

Capped pyrex or quartz test tubes were used in the following examples and the irradiation procedures specified therein were carried out through the tube walls. When sunlight was used as the source of radiation it was further filtered through window glass thus removing radiation with wave lengths shorter than about 350 nm.

argon through it for about 30 seconds. The polymer dissolved to form a clear solution which was irradiated with the 300 nm source for 10 minutes. Vigorous bubbling occurred and the solution became hot (55° C.). After about 15 minutes the mixture had solidified to a clear resinous solid.

EXAMPLE 2

Polysilane P (0.03 g) was added to 10 ml of methyl methacrylate and the tube was allowed to stand in sunlight for a total of about 12 hours over four days. The methyl methacrylate had polymerized to a hard rubbery mass. Additional irradiation for 24 hours with the 300 nm source completed the curing, turning the sample into a hard resin. A control tube of methyl methacrylate which contained no polysilane was irradiated in the same manner, but remained liquid (underwent no polymerization).

EXAMPLE 3

Polysilane P (0.031 g) was added to 8.5 ml of styrene and the reaction tube was corked and shaken then placed in sunlight. After about 19 hours in the sunlight, the solution had become very viscous (about the consistency of thick molasses). It was heated to 120° C. for two hours to yield a soft clear solid. An additional hour of baking produced a clear hard solid. A control tube of styrene was given the same irradiation and heating cycle, but did not polymerize.

EXAMPLE 4

Styrene (8.5 ml) was filtered into a pyrex test tube and polysilane P (0.03 g) was added. About 7.5 ml of styrene monomer was filtered into another test tube. Both tubes were corked, shaken and exposed to bright sunlight for four days. The sample containing the polysilane was barely fluid. It was then heated at 120° C. for 12 hours to form a clear hard solid. The control sample remained a nonviscous liquid throughout and was not heated.

EXAMPLE 5

A mixture of polysilane I (0.54 g) and isooctyl acrylate (9.8 g) was homogenized in a pyrex test tube with ultrasound and degassed with argon for 45 seconds. The resulting white homogenate was irradiated at 350 nm for 10 minutes, set aside for several hours, dissolved in tetrahydrofuran, precipitated with methyl alcohol, filtered and the volatiles were removed in a vacuum oven to yield 5.5 g of sticky material. A 0.05 g portion of this material was added to 5.65 g of fresh isooctyl acrylate and the mixture was irradiated for 25 minutes at 350 nm. It was originally a clear solution which became a clear gel after irradiation.

EXAMPLE 6

A solution of polysilane I (0.02 g) and methyl methacrylate (10.0 ml) was prepared and irradiated as in the preceeding examples. The molecular weight, $\overline{M}_n$ of the polymer was measured and peaks were found at approximately $\overline{M}_n = 1.4 \times 10^6$ and $\overline{M}_n = 6{-}10 \times 10^4$.

EXAMPLE 7

0.0282 g of polysilane J, 10.0 ml of ethyl acrylate, and 10.0 ml of hexane were put into a clear pyrex test tube. The solution was degassed with argon for about 1 minute then irradiated at 300 nm for 50 minutes. The tube was allowed to set for 2 days, then the polymer was frozen in liquid nitrogen and the glass cracked off. The polymer slug was added to 150 ml of stirred tetrahydrofuran and allowed to dissolve. 800 ml H$_2$O were added and the precipitated polymer was collected as a cohesive mass. The polymer was heated at 90° and 1 Torr in a vacuum oven to yield 4.22 g of white elastomeric polymer of $\overline{M}_n$ (GPC) $9.0 \times 10^5$.

The following exemplify the polymerization of styrene and methyl methacrylate (MMA) utilizing the polysilanes of Examples A, B, C, D, E, F, G, H, I, J and P as initiators. Ultrasonic energy was utilized to speed solution or homogenization. Irradiation was over a 3 day period by means of sunlight transmitted through window glass and the walls of the pyrex tubes (in which the polymerizations were carried out). Unless otherwise indicated, 0.03 g of the polysilane and 10 ml of the monomer were used. The results are summarized in Table II.

TABLE II

| Example Number | Polysilane (from Example) | Monomer | Appearance Initial | After 3 Days |
|---|---|---|---|---|
| 8 | A | MMA | soluble; clear | 7% liq. cloudy |
| 9 | A | Styrene | clear | viscous liq. |
| 10 | B | MMA | Translucent: no suspended solid | cloudy; 64% gel; viscous |
| 11 | B | Styrene | faintly cloudy | viscous liquid |
| 12 | C | MMA | soluble; clear | slight cloudy; viscous gel; 80% solid |
| 13 | C | Styrene | clear | visc. liquid |
| 14 | D | MMA | translucent; no suspended solid | 100% rubbery sticky solid |
| 15 | D | Styrene | clear | viscous, liq. |
| 16 | E | MMA | cloudy; some solid on bottom | slight cloudy 80% gel, viscous |
| 17 | E | Styrene | clear | viscous liquid |
| 18 | F | MMA | opaque; solid on bottom | cloudy 100% sl. viscous |
| 19 | F | Styrene | cloudy; solids on bottom | viscous liq. w/insol material |
| 20 | G | MMA | opaque; solid on bottom | clear mostly liq; sl. viscous |
| 21 | G | Styrene | cloudy; solids on bottom | viscous liq. |
| 22 | H | MMA | translucent; no suspended solid | 7% viscous liq. cloudy gel |
| 23 | H | Styrene | slightly cloudy | viscous liq. sl. cloudy |
| 24 | I | MMA | translucent; no suspended solid | clear 100% rubbery solid (not sticky) |
| 25 | I | Styrene | clear | viscous liq. |
| 26 | J* | MMA | clear solution | sl. viscous clear |
| 27 | J | Styrene | clear | viscous liquid |
| 28 | P | MMA | translucent solution | hard rubbery |
| 29 | P | Styrene** | clear solution | very viscous |

*0.09 gram of polysilane
**8.5 ml of styrene

What is claimed is:
1. A process which comprises subjecting a mixture of
(1) a vinyl monomer or prepolymer and;
(2) a soluble polysilane of the formula

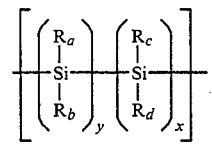

wherein $R_a$, $R_b$, $R_c$ and $R_d$ are individually selected from aliphatic, aromatic, substituted aromatic, araliphatic and cycloaliphatic groups containing not more than about 18 carbon atoms each, and y and x are numbers from about 1 to 19,000, provided that the sum of y and x is from about 2 to 20,000, having a main chain of catenated silicon atoms and a molecular weight ($\overline{M}_n$) of from about $5 \times 10^2$ to $5 \times 10^6$ which absorbs electromagnetic energy in the wavelength range of from about 250 to 400 nanometers to radiation in the range of about 250 to 400 nanometers until the degree of polymerization of the monomer or prepolymer has increased.

2. A process according to claim 1 wherein the mixture contains from about 0.01% to 10% by weight of (2), based on the total weight of (1) and (2).

3. A process according to claim 1 wherein $R_a$, $R_b$, $R_c$ and $R_d$ are individually selected from phenyl, methyl, cyclohexyl, phenethyl and p-methylphenyl.

4. A process according to claim 1 wherein $R_a$ is aromatic or aralkyl and $R_b$, $R_c$ and $R_d$ are aliphatic.

5. A process according to claim 1 wherein $R_a$ and $R_c$ are aromatic or aralkyl and $R_b$ and $R_d$ are aliphatic.

6. A process according to claim 1 wherein $R_a$ is phenyl or phenethyl, $R_b$, $R_c$ and $R_d$ are aliphatic and the ratio of x to y varies from about 3:1 to 1:20.

7. A process according to claim 1 wherein $R_a$ and $R_c$ are the same and are selected from phenyl and phenethyl and $R_b$ and $R_d$ are the same and are selected from aliphatic, aromatic, substituted aromatic, araliphatic and cycloaliphatic groups.

8. A photopolymerizable composition which comprises a mixture of
(1) a vinyl monomer or prepolymer; and
(2) a soluble polysilane of the formula $$\left[ \left( \begin{array}{c} R_a \\ -Si- \\ R_b \end{array} \right)_y \left( \begin{array}{c} R_c \\ -Si- \\ R_d \end{array} \right)_x \right]$$

wherein $R_a$, $R_b$, $R_c$ and $R_d$ are individually selected from aliphatic, aromatic, substituted aromatic, araliphatic and cycloaliphatic groups containing not more than about 18 carbon atoms each, and y and x are numbers from about 1 to 19,000, provided that the sum of y and x is from about 2 to 20,000, having a main chain of catenated silicon atoms and a molecular weight ($\overline{M}_n$) from about $5 \times 10^2$ to $5 \times 10^6$ which absorbs electromagnetic energy in the wavelength range of from about 250 to 400 nanometers.

9. A composition according to claim 11 which contains from about 0.01% to 10% by weight of (2), based on the total weight of (1) and (2).

10. A composition according to claim 8 wherein $R_a$, $R_b$, $R_c$ and $R_d$ are individually selected from phenyl, methyl, cyclohexyl, phenethyl and p-methylphenyl.

11. A composition according to claim 8 wherein $R_a$ is aromatic or aralkyl and $R_b$, and $R_c$ and $R_d$ are aliphatic.

12. A composition according to claim 8 wherein $R_a$ and $R_c$ are aromatic or aralkyl and $R_b$ and $R_d$ are aliphatic.

13. A composition according to claim 8 wherein $R_a$ is phenyl or phenethyl, $R_b$, $R_c$ and $R_d$ are aliphatic and the ratio of x to y varies from about 3:1 to 1:20.

14. A composition according to claim 8 wherein $R_a$ and $R_c$ are the same and are selected from phenyl and phenethyl and $R_b$ and $R_d$ are the same and are selected from aliphatic, aromatic, substituted aromatic, araliphatic and cycloaliphatic groups.

* * * * *

UNITED STATES PATENT AND TRADEMARK OFFICE
CERTIFICATE OF CORRECTION

PATENT NO. : 4,569,953
DATED : February 11, 1986
INVENTOR(S) : Robert C. West and Andrew R. Wolff It is certified that error appears in the above-identified patent and that said Letters Patent is hereby corrected as shown below:

Col. 1, line 21 "of" should read --or--.

Col. 2, line 41 "photoinitiator" should read --photoinitiators--.

Col. 10, line 20 "claim 11" should read --claim 8--.

Signed and Sealed this

Sixth Day of May 1986

[SEAL]

Attest:

DONALD J. QUIGG

Attesting Officer

Commissioner of Patents and Trademarks